United States Patent
Moore

(10) Patent No.: US 9,106,850 B2
(45) Date of Patent: Aug. 11, 2015

(54) DIGITAL IMAGE SENSOR

(71) Applicant: STMicroelectronics (Research & Development) Limited, Marlow, Buckinghamshire (GB)

(72) Inventor: John Kevin Moore, Edinburgh (GB)

(73) Assignee: STMicroelectronics (Research & Development) Limited, Marlow, Buckinghamshire (GB)

(*) Notice: Subject to any disclaimer, the term of this patent is extended or adjusted under 35 U.S.C. 154(b) by 198 days.

(21) Appl. No.: 13/693,748

(22) Filed: Dec. 4, 2012

(65) Prior Publication Data

US 2013/0155302 A1 Jun. 20, 2013

(30) Foreign Application Priority Data

Dec. 15, 2011 (GB) .................................. 1121577.9

(51) Int. Cl.
| | |
|---|---|
| H04N 5/335 | (2011.01) |
| H04N 5/353 | (2011.01) |
| H01L 27/146 | (2006.01) |
| H01L 27/148 | (2006.01) |
| H04N 5/369 | (2011.01) |
| H04N 5/3745 | (2011.01) |
| H04N 9/04 | (2006.01) |

(52) U.S. Cl.
CPC ............ *H04N 5/3535* (2013.01); *H01L 27/146* (2013.01); *H01L 27/148* (2013.01); *H01L 27/14603* (2013.01); *H01L 27/14621* (2013.01); *H04N 5/335* (2013.01); *H04N 5/369* (2013.01); *H04N 5/3745* (2013.01); *H04N 9/045* (2013.01)

(58) Field of Classification Search
CPC ........................ H04N 5/3535; H01L 27/14603
USPC ........................................................ 348/308
See application file for complete search history.

(56) References Cited

U.S. PATENT DOCUMENTS

| | | | | | |
|---|---|---|---|---|---|
| 3,971,065 | A | * | 7/1976 | Bayer | 348/276 |
| 5,597,997 | A | * | 1/1997 | Obata et al. | 235/455 |
| 7,750,278 | B2 | * | 7/2010 | Oike et al. | 250/208.1 |
| 2004/0227832 | A1 | | 11/2004 | Loose | |
| 2005/0173616 | A1 | | 8/2005 | Jang | |
| 2006/0021498 | A1 | * | 2/2006 | Moroz et al. | 89/41.06 |
| 2007/0223904 | A1 | * | 9/2007 | Bloom et al. | 396/100 |
| 2008/0079841 | A1 | * | 4/2008 | Cieslinksi | 348/362 |

(Continued)

FOREIGN PATENT DOCUMENTS

GB 2425229 A 10/2006

OTHER PUBLICATIONS

Uk Search Report for GB1121577.9 dated Apr. 13, 2012 (2 pages).

(Continued)

*Primary Examiner* — Sinh Tran
*Assistant Examiner* — Mark Monk
(74) *Attorney, Agent, or Firm* — Gardere Wynne Sewell LLP

(57) ABSTRACT

A digital imaging sensor includes an array of pixels. A subset of the pixels in the array has reduced photosensitivity in comparison to other pixels in said array. A controller operates to control an integration time of the array of pixels such that a first integration time of the subset of pixels is longer than a second integration time of the other pixels in the array. Such an image sensor is particularly useful for sensing light sources that are not illuminated continuously.

13 Claims, 6 Drawing Sheets

(56) References Cited

U.S. PATENT DOCUMENTS

2008/0179490 A1 7/2008 Ohno et al.
2009/0262215 A1 10/2009 Sano et al.
2011/0221931 A1 9/2011 Wakabayashi et al.
2011/0310278 A1 12/2011 Bai et al.

OTHER PUBLICATIONS

Taghmai, Sohrab: "Technology Trends and Market Opportunities for Image Sensors for Automative Market," ISE2011, London, Mar. 23, 2011 (27 pages).

\* cited by examiner

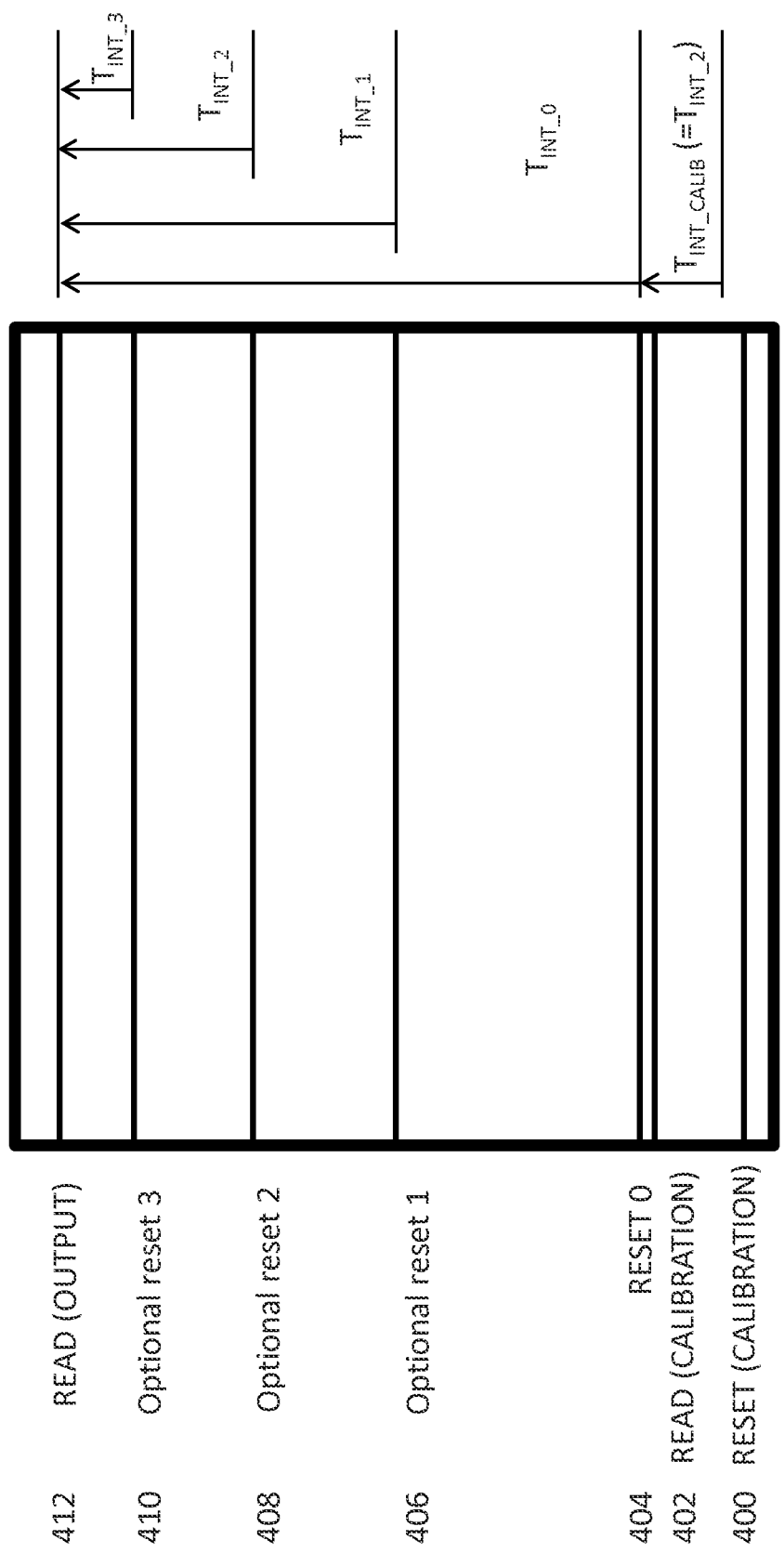

DIGITAL IMAGE SENSOR

PRIORITY CLAIM

This application claims priority from Great Britain Application for Patent No. 1121577.9 filed Dec. 15, 2011, the disclosure of which is hereby incorporated by reference.

TECHNICAL FIELD

The present invention relates to digital image sensors, and in particular such image sensors operable to sense light sources that are not illuminated continuously.

BACKGROUND

Digital image sensing based upon solid state technology is well known, the two most common types of image sensors currently being charge coupled devices (CCD's) and complementary metal oxide semiconductor (CMOS) image sensors. Digital image sensors are incorporated within a wide variety of devices throughout the consumer, industrial and defense sectors, among others.

An image sensor is a device comprising one or more radiation sensitive elements having an electrical property that changes when radiation is incident thereupon, together with circuitry for converting the changed electrical property into a signal. As an example, an image sensor may comprise a photodetector that generates a charge when radiation is incident upon it. The photodetector may be designed to be sensitive to electromagnetic radiation in the range of (human) visible wavelengths, or other neighboring wavelength ranges, such as infra-red or ultra-violet for example. Circuitry is provided that collects and carries the charge from the radiation sensitive element for conversion to a value representing the intensity of incident radiation.

Typically, more than one radiation sensitive element will be provided in an array. The term pixel is used as a shorthand for picture element. In the context of a digital image sensor, a pixel refers to that portion of the image sensor that contributes one value representative of the radiation intensity at that point on the array. These pixel values are combined to reproduce a scene that is to be imaged by the sensor. A plurality of pixel values can be referred to collectively as image data. Pixels are usually formed on and/or within a semiconductor substrate. In fact, the radiation sensitive element comprises only a part of the pixel, and only part of the pixel's surface area (the proportion of the pixel area that the radiation sensitive element takes up is known as the fill factor). Other parts of the pixel are taken up by metallization such as transistor gates and so on. Other image sensor components, such as readout electronics, analogue to digital conversion circuitry and so on may be provided at least partially as part of each pixel, depending on the pixel architecture.

Image sensors of this type may be used for still image capture and for video capture. Even when an image sensor is primarily designed for still image capture, it is common for a video function to be provided for example to provide a viewfinder function in a screen of a digital camera.

Many light sources are not illuminated continuously. For example, fluorescent lamps may flicker with the source frequency. Also, other light sources such as LEDs may actually be pulsed such that they are only switched on for only a short time overall, possibly less than 20% of the time. This improves efficiency, while also making it easier to control brightness via control of the LED's duty cycle (the ratio of time on to the overall time). This pulsing, provided it is fast enough, cannot be resolved by human eyes and therefore the light emitted is perceived by humans as being continuous.

A problem exists where an image needs to be taken of the light source. The exposure time to capture the image may be very short such that there is at least a significant chance, and in the case of the LEDs discussed above a probable chance, that the image will be captured when the source is not actually illuminated, even though the image capture occurs when the LED is "switched on" such that it would appear illuminated to a person. In other words the illumination pulse and exposure time may not actually coincide. To compound this problem, the pulsing is not necessarily predictable and therefore the exposures cannot simply be timed to coincide with pulses.

There are many applications where accurate image capture of an illumination source is not only desirable but essential. One such application involves using sensors of various types at various locations in or on a vehicle such as an automobile. Image sensors may be provided to perform various functions based on detection of images inside the vehicle and outside the vehicle. These can include light detection systems, for example, brake light detection (brake lights now commonly comprise LEDs or other pulsed sources). It is clearly very important that such systems are able to accurately sense whether the light is active.

There is a need in the art to provide an image sensor that addresses one or more of the above issues.

BRIEF DESCRIPTION OF THE DRAWINGS

Embodiments of the invention will now be described, by way of example only, by reference to the accompanying drawings, in which:

FIG. 4 shows a further multiple exposure high dynamic range method;

FIGS. 6*a* to 6*c* illustrate different attenuation patterns for a pixel array.

DETAILED DESCRIPTION OF THE EMBODIMENTS

Figure 1:
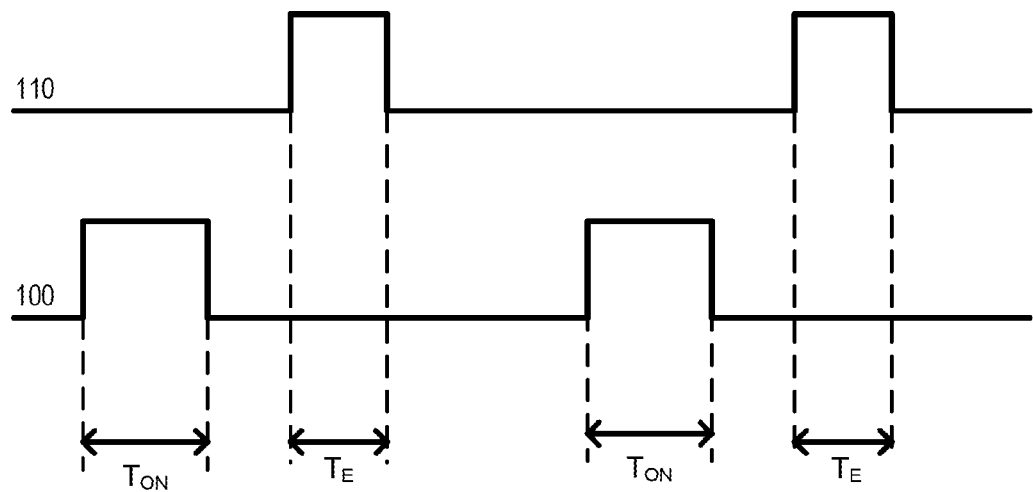
FIG. 1 shows waveforms for a pulsed LED and pixel exposure illustrating the problem of the prior art.

FIG. 1 illustrates the problem of capturing images comprising illumination sources which are not illuminated continuously. Waveform 100 is a typical pulsed waveform for powering an illumination source such as an LED. An LED powered in this way will appear continuously illuminated to the human eye, providing the pulse frequency is sufficiently high. As can be seen the LED is only actually on, and therefore illuminated, when the waveform 100 is high, that is during time $T_{ON}$. This represents only a fraction of the total time that the LED is being driven by the waveform 100.

Also seen in FIG. 1 is waveform 110 representing the exposure time of a digital image sensor such as that comprising a plurality of pixels. Such an image sensor may be a CMOS imaging device. The pixel is "exposed" (the pixel integrates light incident on it) when the waveform 110 is high, that is during exposure time $T_E$. This represents the time during which the image is captured.

Problems arise when exposures used are shorter than, or close to the lighting frequency, as is illustrated here. It is apparent that the exposure time $T_E$ does not coincide with LED on time $T_{ON}$. Consequently the LED will appear to not be illuminated in the captured image. In some applications this can be more than simply undesirable. Where the image capture means forms part of a sensor that is operable to sense the state of an illumination source, for example by measuring the intensity of one or more pixels of a captured image, this failure of the exposure time $T_E$ to coincide with the LED on time $T_{ON}$ will mean that the sensor is liable to return false negative results. This would render the sensor unable to operate reliably.

One solution would be to simply increase the exposure time $T_E$, to ensure that it would always coincide with LED on time $T_{ON}$, when the LED was being driven. However, this is likely to adversely affect dynamic range, resulting in saturation of the sensor. To address this it is possible to make the sensor less sensitive. This though would affect the dynamic range at the other end of the intensity scale, degrading low level performance.

It is therefore proposed to reduce sensitivity of only a subset of pixels, and exposing these reduced sensitivity pixels for a greater length of time than that of the remaining pixels having unreduced sensitivity. In this way, some pixels will have high sensitivity, while others will perform better for pulsed light sources.

The sensitivity of each pixel may be configurable by the addition of an attenuation filter. Alternatively it may be possible to alter the pixel itself, by changing the sensitive area.

Figure 2:
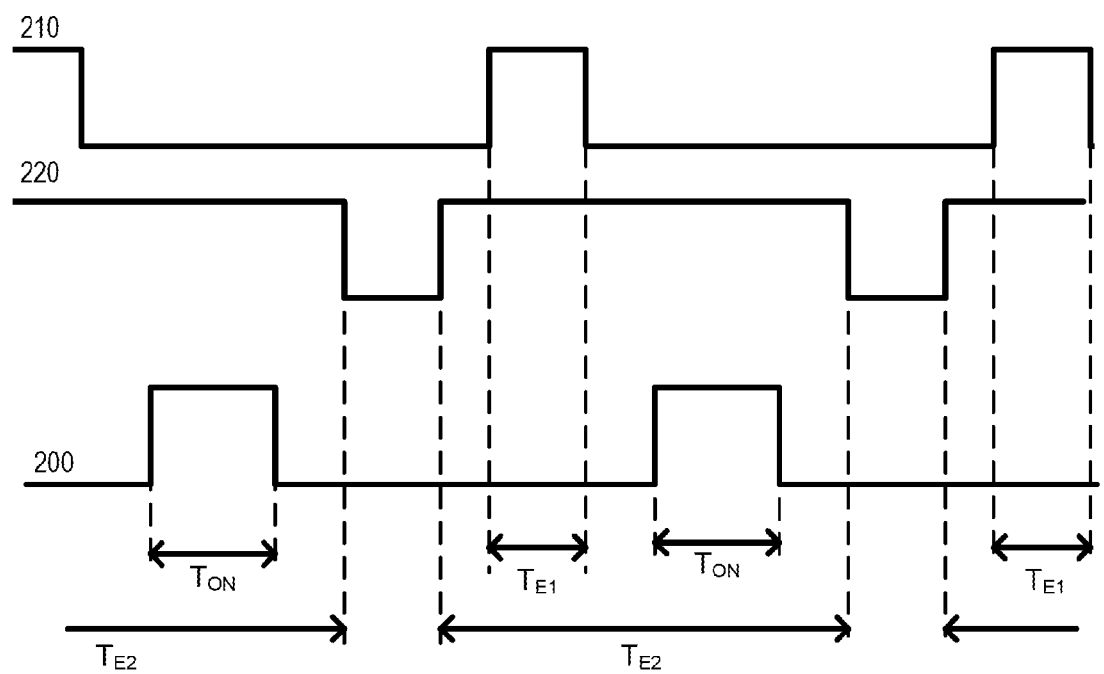
FIG. 2 shows waveforms for a pulsed LED and pixel exposures.

FIG. 2 illustrates this proposal. Waveform 200 corresponds to waveform 100, and again shows a typical pulsed waveform for powering an LED. Waveform 210 corresponds to waveform 110, and represents the exposure time $T_{E1}$ of a first pixel or subset of pixels having normal, unattenuated, sensitivity. Waveform 220 represents the exposure time $T_{E2}$ of a first pixel or subset of pixels of reduced sensitivity. Because of their reduced sensitivity, the exposure time $T_{E2}$ can be greatly increased compared to that of exposure time $T_{E1}$. In particular, exposure time $T_{E2}$ can be so long as to always coincide with at least part of the LED on time $T_{ON}$. Consequently the reduced sensitivity pixel(s) will always be able to sense that the LED is activated.

Figure 3:
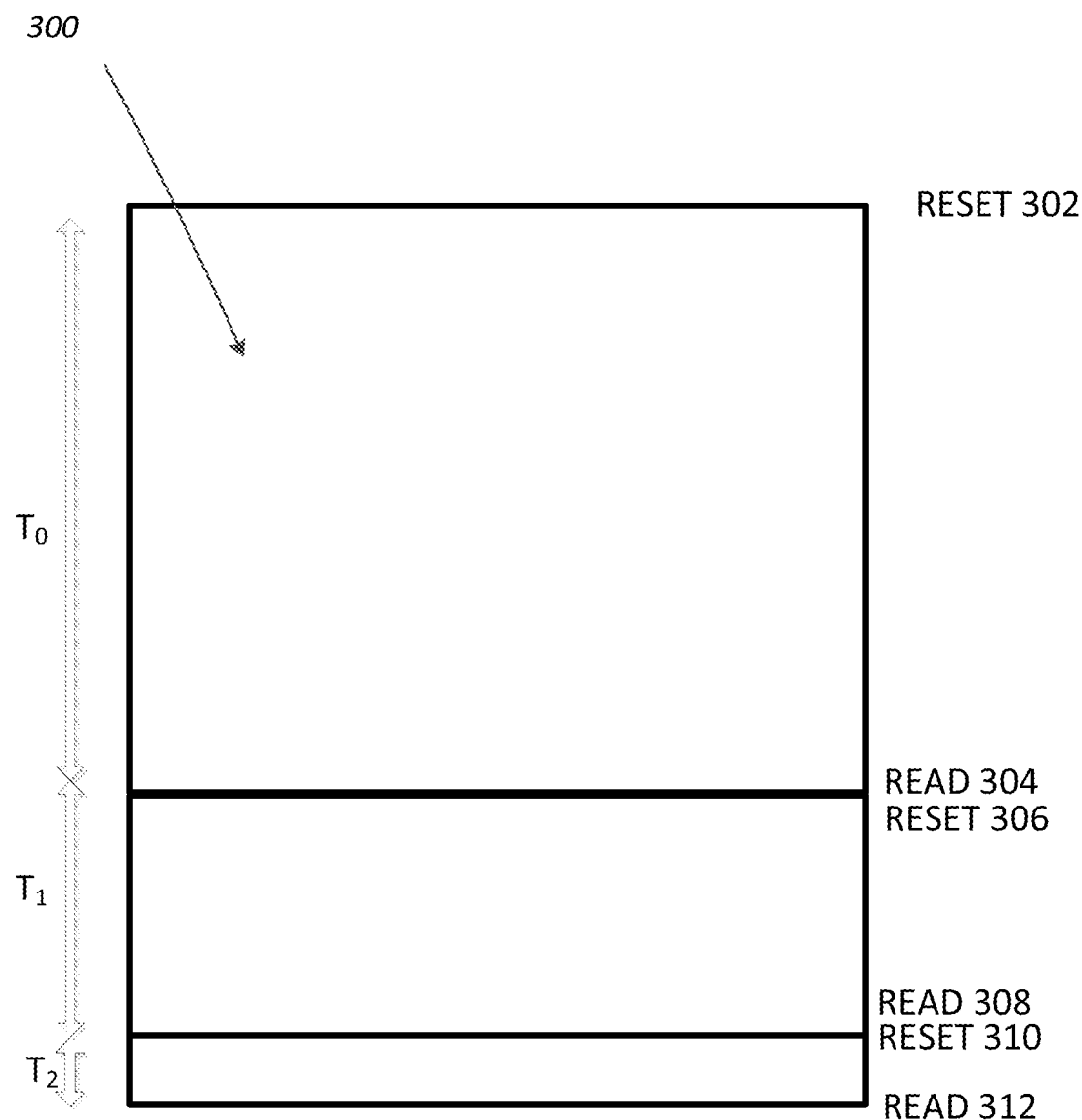
FIG. 3 illustrates a possible method of multiple exposures for increasing dynamic range.

It is possible to improve on the dynamic range of an image by using multiple exposures, each with different integration times. These concepts may be used with the concepts disclosed herein. FIG. 3 illustrates the basic principle of such an arrangement. A pixel array 300 has pixels arranged in rows. FIG. 3 shows a snapshot in time where pixel rows 302, 306, and 310 are being reset and pixel rows 304, 308 and 312 are being read out. The number of rows between each pair of reset and read wavefronts ({302, 304}, {306, 308} and {310, 312}) define different integration times (exposures) $T_0$, $T_1$ and $T_2$.

Normally, of course, the long exposures would be used to sense low light levels and the pixels would saturate if detecting an illumination event such as an LED becoming active. However, provided that (at least some of) the pixels being exposed with long exposure times are suitably attenuated, they can be used to detect such illumination events. Some of the long exposure pixels may be unattenuated so as to also sense low level light as is conventional in high dynamic range imaging.

FIG. 4 illustrates an alternative readout scheme for high dynamic range imaging which may be used in combination with the concepts disclosed herein, and is described in more detail in co-pending application entitled Image Sensor With Improved Dynamic Range (docket 132670-1050), filed as Great Britain Application for Patent No. 1121688.4 filed Dec. 16, 2011, the disclosure of which is hereby incorporated by reference. According to this scheme, an initial reset operation 400 is performed, followed by a first read operation 402. The initial reset and first read operations 400, 402 are separated by an integration time T_INT_CALIB. This initial integration time is used for a calibration measurement. The value of the code read out during this initial integration time (or "calibration time") is used as an indicator for setting the exposure period to be used for other pixels (for example, the other rows or the other columns) in the array.

Following the calibration read 402, a reset 404 is performed. Following this reset is a final read operation 412. Before this final read operation 412, it is possible to perform an additional, optional, reset operation. In this case there are three available additional, optional, reset operations 406, 408, 410. The number and spacing of the optional reset operations may be varied according to the wishes of the designer. These additional available reset operations may correspond to preset predetermined integration periods which can be used following the selective operation of none or one of the additional optional reset operations 406, 408, 410.

The decision to selectively operate none or one of the additional optional reset operations 406, 408, 410, can be based on the value of the calibration data that is read out at calibration read 402. Separate decision logic circuitry can be provided to take as its input the value of the calibration data and then output a control signal for the pixel circuitry based on the input calibration data. If the output code of the calibration read 402 yields a relatively low value, then decision logic circuitry can be set to ignore all of the optional resets 406, 408, 410 and use the longest available integration period T_INT_0 for the rest of the array. If, on the other hand, the value read out at the calibration rate is relatively high, the decision logic may enable the last available optional reset 410, setting the shortest possible exposure time for use in the array. The decision logic may be calibrated to enable one of the other optional reset values depending upon the value read out at 402. The decision logic circuitry can be calibrated with appropriate thresholds for making these decisions.

The method may be further enhanced by using both the vertical and horizontal addressing of pixels being read out, so that different pixels belonging to the same row can have different exposure times. According to this embodiment, a decision is made at the time of the calibration readout 402 for each pixel in the row, and this decision is stored in memory. Therefore, if one pixel of the row yields a relatively high value, a short exposure time can be set for the other pixels in the column to which that pixel belongs, while simultaneously, if another pixel of the same row yields a relatively low value, a long exposure time can be set for the other pixels in the column to which that pixel belongs. That is, each of the optional additional resets 406, 408, 410 can be applied selectively to individual pixels of each row, rather than needing to be applied across the whole rows. The read wavefront 412 is still applied to all pixels in each row as the wavefront progresses, but due to the preceding column-wise selectivity of the additional optional resets, the pixels in the row can have different exposures if needed.

Figure 5A:
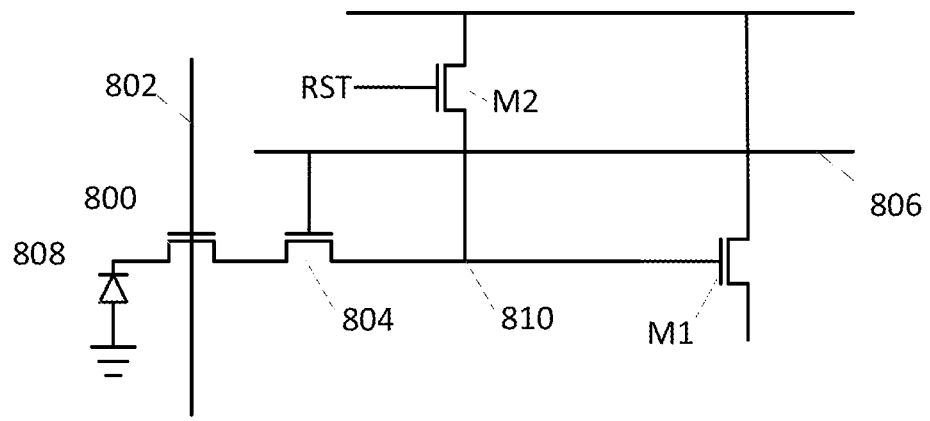
FIGS. 5*a* and 5*b* respectively show first and second example pixel structures for implementing pixel addressing in a readout operation.
Figure 5B:
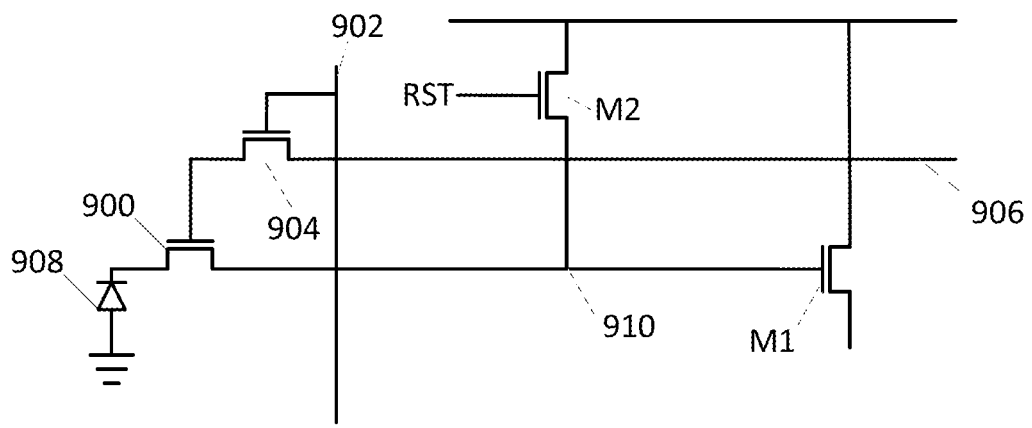

To enable both vertical and horizontal addressing of the pixels a modified pixel structure such as that shown in FIGS. 5a and 5b may be used. These use multiple transistors to enable the pixel reset operation to be dependent on two input signals. In FIG. 5a, a first transfer gate 800 is connected to a vertical pixel address line 802 while a second transfer gate 804 is connected to a horizontal pixel address line 806. Charge will be transferred from the pinned photodiode 808 to the floating diffusion node 810 only when both the vertical and horizontal address lines 802, 806 are driven high. Operation of the pixel is then controlled via reset transistor M2, and source follower (amplification) transistor M1.

FIG. 5b illustrates an alternative pixel structure to that of FIG. 5a, comprising first transfer gate 900 and second transfer gate 904. The second transfer gate 904 is connected at its gate to vertical address line 902 and at its drain to horizontal address line 906. If the vertical address line is pulled low then a reset pulse applied on the horizontal control line will not be passed to the gate of the Transfer Gate transistor. The gate of the Transfer Gate transistor is left to float for a short period. Clearly more complex logic could be implemented so this node never floats. This would require more transistors and, consequently, reduced sensitivity.

The ability to individually control exposure times of pixels in a single row also provides greater flexibility in controlling the pixels that are to be made less sensitive so as to sense pulsed light sources.

In all of the embodiments described herein, exposure times could (for example) range from around 20 µs (1 line time) to a full frame (2 ms, where the frame comprises 1000 lines). To be completely sure of catching an LED pulse of any length, an exposure time of 2 ms would be recommended.

For high dynamic applications, exposure time depends on the number of integration fronts. It could range from 1 line (or even less than this) to an exposure equal to the number of lines. The length of each exposure can be roughly set to keep the ratios between exposures constant (for example: 1 line, 10 lines, 100 lines, 1000 lines for four fronts), although this is not necessary.

Figures 6A, 6B:
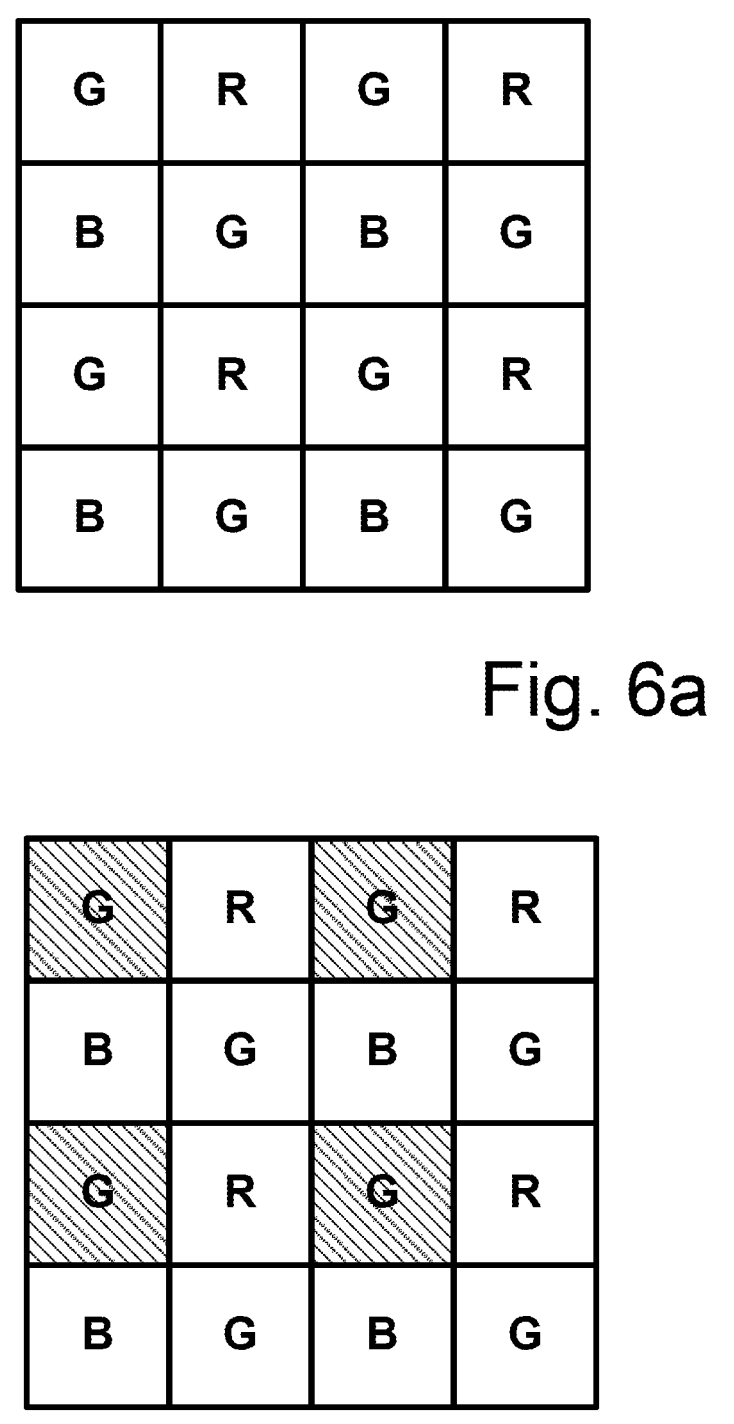
Figure 6C:
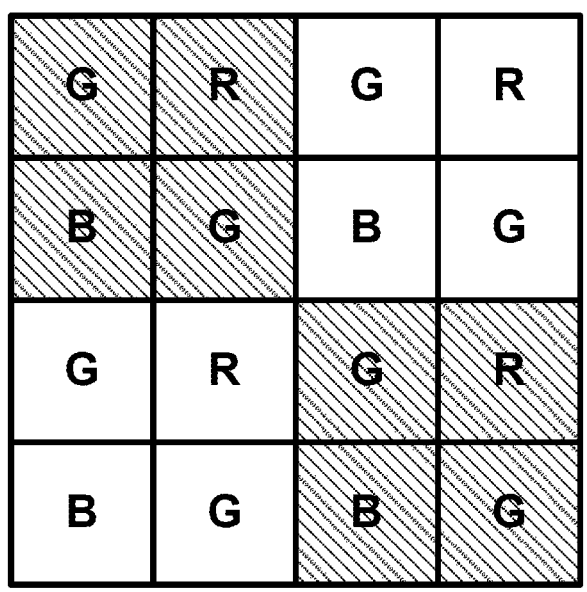

FIGS. 6a to 6c show a couple of examples of possible attenuation arrangements, purely for illustration. FIG. 6a shows the well known Bayer filter pattern with two green (G) filter elements to every one blue (B) and one red (R) filter element, arranged as shown in 2×2 RGBG groups. Each filter element corresponds to a pixel element of a pixel array. This pattern is repeated over the entire pixel array.

FIG. 6b shows an arrangement where one of the two green elements in each 2×2 RGBG group is attenuated (shown shaded) to reduce its sensitivity in accordance with the concepts described herein. In FIG. 6c, it is whole 2×2 RGBG groups that are attenuated (shown shaded) to reduce their sensitivity. In the specific example shown, half of the 2×2 RGBG groups are attenuated, although this could be a different fraction. As explained above, it is the attenuated pixels which are exposed with the long exposure times.

The above examples are provided for illustration only and other embodiments and variations can be envisaged without departing from the spirit and scope of the invention.

What is claimed is:

1. A digital imaging sensor, comprising:
    an array of pixels arranged in columns and rows, wherein each column and row includes a plurality of pixels, wherein a subset of the plurality of pixels in a given row of said array has reduced photosensitivity in comparison to other pixels in said given row of said array;
    and a control circuit configured to control an integration time of said array of pixels such that a first integration time of said subset of pixels of reduced sensitivity in said array is longer than a second integration time of said other pixels in said array;
    wherein each pixel comprises:
    a reset transistor coupled between a reference supply node and a floating node;
    a pinned photodiode;
    and first and second transfer transistors coupled between the floating node and the pinned photodiode, wherein the first transfer transistor is gate controlled by a first control signal on a vertical address line for the column and the second transfer transistor is gate controlled by a second control signal on a horizontal address line for the row;
    said control circuit operable to control said integration time of each pixel by controlling the timing of the first and second control signals applied to individual pixels of the subset of the plurality of pixels in the given row through the vertical and horizontal address lines for pixels of said subset in the pixel array.

2. The digital imaging sensor as claimed in claim 1, wherein said first integration time is between three and five times longer than said second integration time.

3. The digital imaging sensor as claimed in claim 1, wherein said first integration time is 2 ms.

4. The digital imaging sensor as claimed in claim 1, wherein an attenuation is provided for each pixel of said subset of pixels in the given row of said array to reduce their photosensitivity.

5. The digital imaging sensor as claimed in claim 1, wherein said array of pixels is provided with a Bayer filter, said subset of pixels comprising substantially half of the pixels to which a green filter is applied.

6. The digital imaging sensor as claimed in claim 1, wherein said array of pixels is provided with a Bayer filter comprising a plurality of 2×2 RGBG pixel groups, said subset of pixels comprising a subset of said 2×2 RGBG pixel groups.

7. The digital imaging sensor as claimed in claim 1, wherein:
    the first transfer transistor is connected between the pinned photodiode and an intermediate node;
    the second transfer transistor is connected between the intermediate node and the floating node;
    and each pixel is operable such that charge will be transferred from the pinned photodiode to the floating node through the first and second transfer transistors only when both the vertical and horizontal address lines are active.

8. The digital imaging sensor as claimed in claim 1, wherein:
    the first transfer transistor is connected between the pinned photodiode and the floating node; and
    the second transfer transistor is connected at its source to the gate of said first transfer transistor,
    wherein said second transfer transistor is connected at its gate to the vertical address line and at its drain to the horizontal address line, such that that if the vertical address line is pulled low then the second control signal applied on the horizontal address line will not be passed to the gate of the first transfer transistor.

9. An illumination sensor operable to determine whether an illumination source is being driven, said illumination sensor comprising a digital imaging sensor, said digital imaging sensor comprising:
    an array of pixels arranged in columns and rows, wherein each column and row includes a plurality of pixels, wherein a subset of the plurality of pixels in a given row of said array has reduced photosensitivity in comparison to other pixels in said given row of said array;
    and a control circuit configured to control an integration time of said array of pixels such that a first integration time of said subset of pixels of reduced sensitivity in the given row of said array is longer than a second integration time of said other pixels in the given row of said array;

wherein each pixel comprises:
a reset transistor coupled between a reference supply node and a floating node;
a pinned photodiode;
and first and second transfer transistors coupled between the floating node and the pinned photodiode, wherein the first transfer transistor is gate controlled by a first control signal on a vertical address line for the column and the second transfer transistor is gate controlled by a second control signal on a horizontal address line for the row;
said control circuit operable to control said integration time of each pixel by controlling the timing of the first and second control signals applied to individual pixels of the subset of the plurality of pixels in the given row through the vertical and horizontal address lines for pixels of said subset in the pixel array.

10. A camera comprising a digital imaging sensor, said digital imaging sensor comprising:
an array of pixels arranged in columns and rows, wherein each column and row includes a plurality of pixels, wherein a subset of the plurality of pixels in a given row of said array has reduced photosensitivity in comparison to other pixels in said given row of said array;
and a control circuit configured to control an integration time of said array of pixels such that a first integration time of said subset of pixels of reduced sensitivity in the given row of said array is longer than a second integration time of said other pixels in the given row of said array;
wherein each pixel comprises:
a reset transistor coupled between a reference supply node and a floating node;
a pinned photodiode;
and first and second transfer transistors coupled between the floating node and the pinned photodiode, wherein the first transfer transistor is gate controlled by a first control signal on a vertical address line for the column and the second transfer transistor is gate controlled by a second control signal on a horizontal address line for the row;
said control circuit operable to control said integration time of each pixel by controlling the timing of the first and second control signals applied to individual pixels of the subset of the plurality of pixels in the given row through the vertical and horizontal address lines for pixels of said subset in the pixel array.

11. The digital imaging sensor as claimed in claim 1, wherein:
the first transfer transistor is connected between the pinned photodiode and an intermediate node;
the second transfer transistor is connected between the intermediate node and the floating node;
and each pixel is operable such that a reset signal will be transferred to the pinned photodiode from the floating node through the first and second transfer transistors only when both the vertical and horizontal address lines are active.

12. The digital imaging sensor as claimed in claim 1, wherein:
the first transfer transistor is connected between the pinned photodiode and an intermediate node;
the second transfer transistor is connected between the intermediate node and the floating node;
and each pixel is operable such that charge will be transferred from the pinned photodiode to the floating node through at least one of the first and second transfer transistors only when both the vertical and horizontal address lines are active.

13. The digital imaging sensor as claimed in claim 1, wherein:
the first transfer transistor is connected between the pinned photodiode and an intermediate node;
the second transfer transistor is connected between the intermediate node and the floating node;
and each pixel is operable such that a reset signal will be transferred to the pinned photodiode from the floating node through at least one of the first and second transfer transistors only when both the vertical and horizontal address lines are active.

* * * * *